(12) United States Patent
Wu et al.

(10) Patent No.: US 11,340,691 B2
(45) Date of Patent: May 24, 2022

(54) HEAT DISSIPATION APPARATUS WITH ENERGY-SAVING EFFECT AND METHOD OF CONTROLLING THE SAME

(71) Applicant: Delta Electronics, Inc., Taoyuan (TW)

(72) Inventors: Chia-Feng Wu, Taoyuan (TW); Po-Hui Shen, Taoyuan (TW); Chien-Sheng Lin, Taoyuan (TW); Chun-Chieh Tsai, Taoyuan (TW); Chia-Wei Hsu, Taoyuan (TW); Rou-Sheng Wang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 16/852,448

(22) Filed: Apr. 18, 2020

(65) Prior Publication Data
US 2021/0089111 A1    Mar. 25, 2021

(30) Foreign Application Priority Data
Sep. 19, 2019 (CN) .......................... 201910885540.5

(51) Int. Cl.
G06F 1/32 (2019.01)
G06F 1/28 (2006.01)
H05K 7/20 (2006.01)
G06F 1/3287 (2019.01)
G06F 1/3206 (2019.01)

(52) U.S. Cl.
CPC ............ *G06F 1/3287* (2013.01); *G06F 1/28* (2013.01); *G06F 1/3206* (2013.01); *H05K 7/20945* (2013.01)

(58) Field of Classification Search
CPC ........ G06F 1/08; G06F 1/3206; G06F 1/3287; G06F 1/28; H05K 7/20945
See application file for complete search history.

(56) References Cited

U.S. PATENT DOCUMENTS

| | | | | |
|---|---|---|---|---|
| 6,023,402 A * | 2/2000 | Kaminski | ............. | G06F 1/3228 361/103 |
| 6,236,184 B1 * | 5/2001 | Baker | .................. | H02M 7/003 318/803 |
| 6,321,029 B1 * | 11/2001 | Kuo | ....................... | G06F 1/206 388/800 |
| 7,996,694 B2 * | 8/2011 | Bold | ...................... | G06F 1/206 713/320 |
| 2003/0023889 A1 * | 1/2003 | Hofstee | ................ | G06F 1/3203 713/322 |
| 2004/0139256 A1 * | 7/2004 | Lee | ....................... | G06F 1/3203 710/104 |

(Continued)

*Primary Examiner* — Jaweed A Abbaszadeh
*Assistant Examiner* — Cheri L Harrington
(74) *Attorney, Agent, or Firm* — Chun-Ming Shih; HDLS IPR Services (57) ABSTRACT

A heat dissipation apparatus with energy-saving effect is coupled to an operation unit, and the heat dissipation apparatus includes a control unit and a drive circuit. The control unit determines whether the operation unit enters an energy-saving mode according to a first signal provided by the operation unit. The control unit shields a plurality of second signals provided to the drive circuit according to the energy-saving mode. The drive circuit does not drive the heat dissipation unit and the heat dissipation unit enters an inertia deceleration.

8 Claims, 9 Drawing Sheets

(56) References Cited

U.S. PATENT DOCUMENTS

| | | | |
|---|---|---|---|
| 2005/0013114 A1* | 1/2005 | Ha | G06F 1/206 |
| | | | 361/679.48 |
| 2010/0289438 A1* | 11/2010 | Fan Chiang | H02P 6/06 |
| | | | 318/400.3 |
| 2012/0112679 A1* | 5/2012 | Tang | H02P 6/06 |
| | | | 318/494 |
| 2014/0115348 A1* | 4/2014 | Sun | G06F 1/3287 |
| | | | 713/300 |
| 2014/0181562 A1* | 6/2014 | Das | G06F 1/206 |
| | | | 713/324 |
| 2015/0305197 A1* | 10/2015 | King | H05K 7/207 |
| | | | 361/695 |
| 2016/0239067 A1* | 8/2016 | Lovicott | G06F 1/206 |
| 2017/0351448 A1* | 12/2017 | Brown | G06F 11/1441 |
| 2021/0026430 A1* | 1/2021 | Nakamura | H05K 7/20209 |
| 2021/0089111 A1* | 3/2021 | Wu | G06F 1/3206 |

* cited by examiner

HEAT DISSIPATION APPARATUS WITH ENERGY-SAVING EFFECT AND METHOD OF CONTROLLING THE SAME

BACKGROUND

Technical Field

The present disclosure relates to a heat dissipation apparatus with energy-saving effect and a method of controlling the same, and more particularly to a heat dissipation apparatus and a method of controlling the same to achieve the with energy-saving effect by using shielding control signals.

Description of Related Art

The statements in this section merely provide background information related to the present disclosure and do not necessarily constitute prior art.

As today's electronic systems are increasingly demanding of energy-saving, power-saving, and low-power consumption, when computers, servers, and other communication devices enter a power-saving mode or a lower-operation mode, the computing unit of the computer or server generates less heat. At this condition, the heat dissipation apparatus does not need to operate in a high heat-dissipation mode to avoid waste of power. Therefore, when the communication device such as the computer or the server enters the power-saving mode or the lower-operation mode, the heat dissipation apparatus usually enters a low heat-dissipation mode to save power consumption.

However, the conventional manner of controlling the heat dissipation apparatus does not take into account the above-mentioned demands for energy saving, power saving, and low power consumption between the mode conversion. Therefore, when a communication device such as a computer or a server enters the power-saving mode, the period in which the heat dissipation apparatus is converted from the high heat-dissipation mode to the low heat-dissipation mode is too long, and the action of converting the heat-dissipation modes cannot be completed quickly, and a lot of unnecessary power is wasted during the mode conversion.

In addition, since the speed of the heat dissipation apparatus is rapidly decreased, the current of the heat dissipation apparatus is dropped too fast, resulting in a current overshoot condition. The current overshoot condition directly affects the operational stability of the heat dissipation apparatus, and even the risk of abnormal failure of the heat dissipation apparatus failure due to current overshoot condition. Therefore, the period during which the heat dissipation apparatus is converted from the high heat-dissipation mode to the low heat-dissipation mode is limited by the above conditions so that the conversion period of the heat-dissipation mode of the heat dissipation apparatus cannot be shortened.

Therefore, how to design a heat dissipation apparatus with energy-saving effect to quickly convert the heat-dissipation mode of the heat dissipation apparatus by a shielding control signal is an important subject for the inventors of the present disclosure.

SUMMARY

In order to solve the above-mentioned problems, a heat dissipation apparatus with energy-saving effect is provided. The heat dissipation apparatus includes a control unit and a drive circuit. The control unit is coupled to the operation unit. The drive circuit is coupled to the control unit and a heat dissipation unit. The control unit determines whether the operation unit enters an energy-saving mode according to a first signal provided by the operation unit, and the control unit shields a plurality of second signals provided to the drive circuit according to the energy-saving mode so that the heat dissipation unit enters an inertia deceleration.

In order to solve the above-mentioned problems, a method of controlling a heat dissipation apparatus with energy-saving effect is provided. The method includes the steps of: receiving a first signal provided by the an operation unit, determining whether the operation unit enters an energy-saving mode according to the first signal, shielding a plurality of second signals provided to a drive circuit according to the energy-saving mode, and making a heat dissipation unit coupled to the drive circuit enter an inertia deceleration.

It is to be understood that both the foregoing general description and the following detailed description are exemplary, and are intended to provide further explanation of the present disclosure as claimed. Other advantages and features of the present disclosure will be apparent from the following description, drawings and claims.

BRIEF DESCRIPTION OF DRAWINGS

The present disclosure can be more fully understood by reading the following detailed description of the embodiment, with reference made to the accompanying drawings as follows.

DETAILED DESCRIPTION

Reference will now be made to the drawing figures to describe the present disclosure in detail. It will be understood that the drawing figures and exemplified embodiments of present disclosure are not limited to the details thereof.

Figure 1:
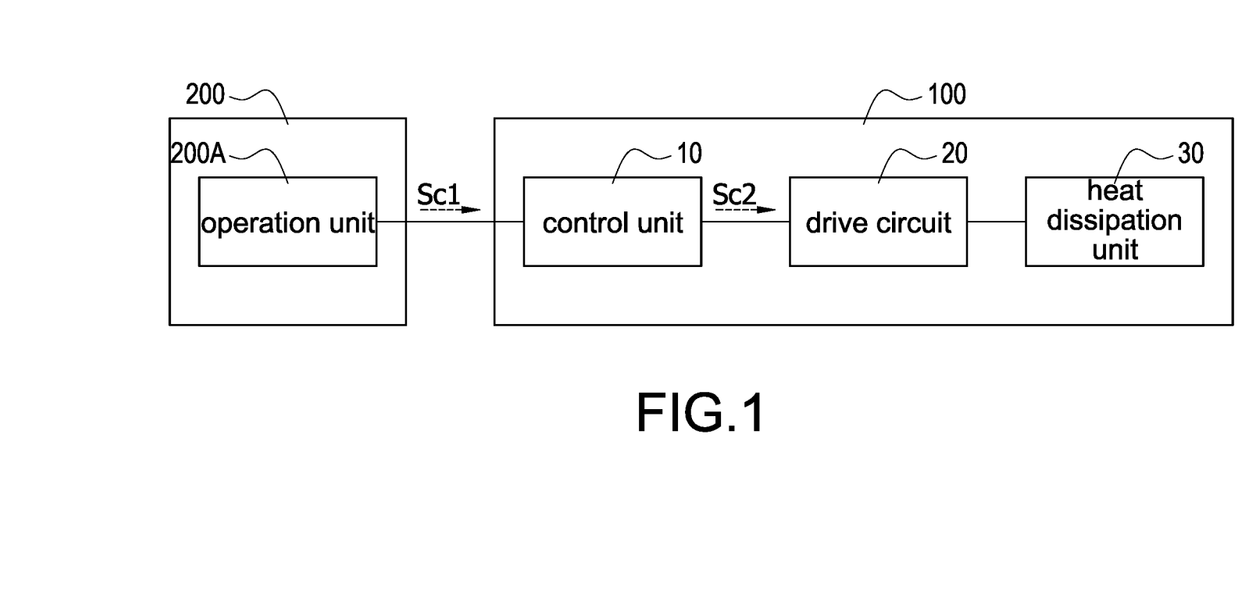
FIG. 1 is a block circuit diagram of a heat dissipation apparatus with energy-saving effect according to the present disclosure.

Please refer to FIG. 1, which shows a block circuit diagram of a heat dissipation apparatus with energy-saving effect according to the present disclosure. The heat dissipation apparatus 100 is coupled to an operation unit 200A of a system 200, such as a computer, a server, or so on. The operation unit 200A is dissipated by the heat dissipation apparatus 100 to prevent the temperature of the operation unit 200A from being too high to cause the system 200 to malfunction. The operation modes of the operation unit 200A includes a normal working mode with high efficiency operation and an energy-saving mode (also referred to as a sleep mode or a standby mode) with low energy consumption. The operation unit 200A actively switches its operation mode between the normal working mode and the energy-saving mode according to its own operation conditions. When the operation unit 200A operates in the normal working mode, the operation unit 200A generates a large amount of heat so that the heat dissipation apparatus 100 has to operate in a high heat-dissipation mode to provide an effective heat-dissipating capability to prevent the temperature of the operation unit 200A from being too high. When the operation unit 200A operates in the energy-saving mode, the heat generated from the operation unit 200A is usually small, and the heat dissipation apparatus 100 does not need to operate in the high heat-dissipation mode so that the heat dissipation apparatus 100 can be adjusted to operate in a low heat-dissipation mode to save the energy consumption of the heat dissipation apparatus 100. The heat dissipation apparatus 100 includes a control unit 10, a drive circuit 20, and a heat dissipation unit 30. The control unit 10 is coupled to the operation unit 200A, and the drive circuit 20 is coupled to the control unit 10 and the heat dissipation unit 30.

Specifically, the control unit 10 receives a first control signal Sc1 provided from the operation unit 200A, and the control unit 10 determines that the operation unit 200A operates in the normal working mode or the energy-saving mode according to the first control signal Sc1. The heat dissipation unit 30 may be a fan-type heat-dissipating component. The control unit 10 provides a plurality of second control signals Sc2 to the drive circuit 20 so that the drive circuit 20 drives the heat dissipation unit 30 to rotate. When the control unit 10 determines that the operation unit 200A operates in the normal working mode according to the first control signal Sc1, the control unit 10 adjusts the rotating speed of the heat dissipation unit 30 by adjusting the second control signals Sc2, and thereby providing an effective heat-dissipating capability according to the operation condition of the operation unit 200A to prevent the temperature of the operation unit 200A from being too high. When the control unit 10 determines that the operation unit 200A operates in the energy-saving mode according to the first control signal Sc1, it means that the operation unit 200A generates less heat, and therefore the heat dissipation apparatus 100 can be adjusted to the low heat-dissipation mode by reducing the rotating speed of the heat dissipation unit 30 to save energy consumption of the heat dissipation apparatus 100. At this condition, the control unit 10 shields the second control signals Sc2 according to the first control signal Sc1, that is, the control unit 10 does not provide the second control signals Sc2 to the drive circuit 20. If the drive circuit 20 does not receive the second control signals Sc2, the drive circuit 20 cannot control the heat dissipation unit 30 so that the heat dissipation unit 30 enters an inertia deceleration. Therefore, fan blades of the heat dissipation unit 30 inertially rotate and gradually reduce the speed thereof when the heat dissipation unit 30 is not controlled.

Figure 2A:
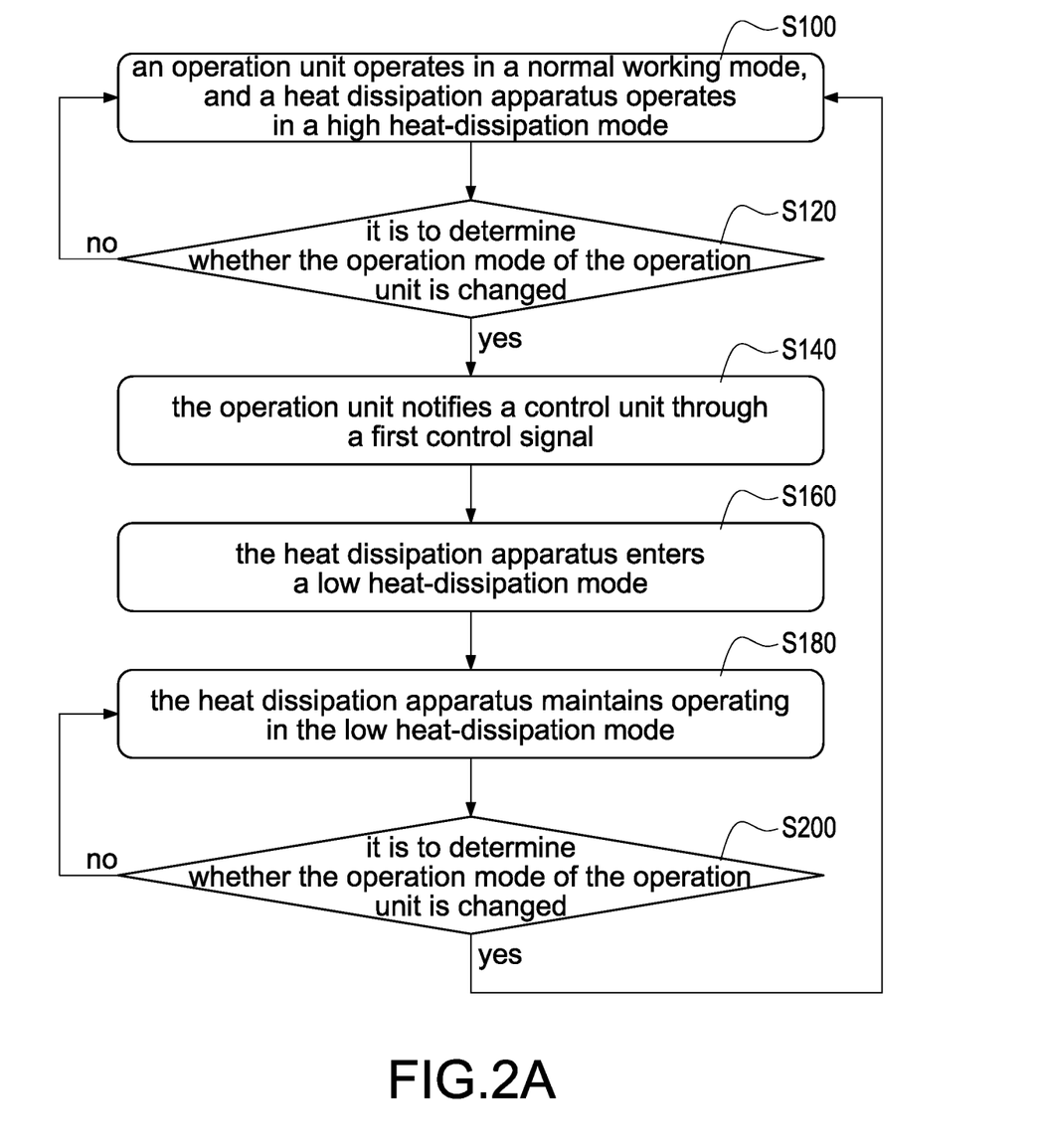
FIG. 2A is a flowchart of a system operation mode according to the present disclosure.

Please refer to FIG. 2A, which shows a flowchart of a system operation mode according to the present disclosure, and also refer to FIG. 1. When the operation unit 200A operates in the normal working mode, the heat dissipation apparatus 100 operates in a high heat-dissipation mode (S100). When the operation unit 200A operates in the normal working mode, the heat dissipation apparatus 100 has to operate in the high heat-dissipation mode and provides effective heat-dissipating capability according to the working condition of the operation unit 200A. Afterward, it is to determine whether the operation mode of the operation unit 200A is changed (S120). The operation unit 200A continuously self-detects whether the operation mode thereof is changed or not. If the operation mode is not changed, the process returns to the step (S100). Afterward, if the operation mode is changed, the operation unit 200A notifies the control unit 10 through the first control signal Sc1 (S140). Afterward, the heat dissipation apparatus 100 enters the low heat-dissipation mode (S160). The control unit 10 realizes that the operation unit 200A operates in the energy-saving mode through the first control signal Sc1, and therefore the control unit 10 controls the heat dissipation apparatus 100 to operate from the high heat-dissipation mode to the low heat-dissipation mode. Afterward, it is to maintain that the heat dissipation apparatus 100 operates in the low heat-dissipation mode (S180). When the operation unit 200A continuously operates in the energy-saving mode, the heat dissipation apparatus 100 can continuously operate in the low heat-dissipation mode so as to save energy consumption of the heat dissipation apparatus 100. Finally, it is to determine whether the operation mode of the operation unit 200A is changed (S200). The operation unit 200A continuously self-detects whether the operation mode thereof is changed or not. If the operation mode is not changed, the process returns to the step (S180); if the operation mode is changed, the process returns to the step (S100).

Figure 2B:
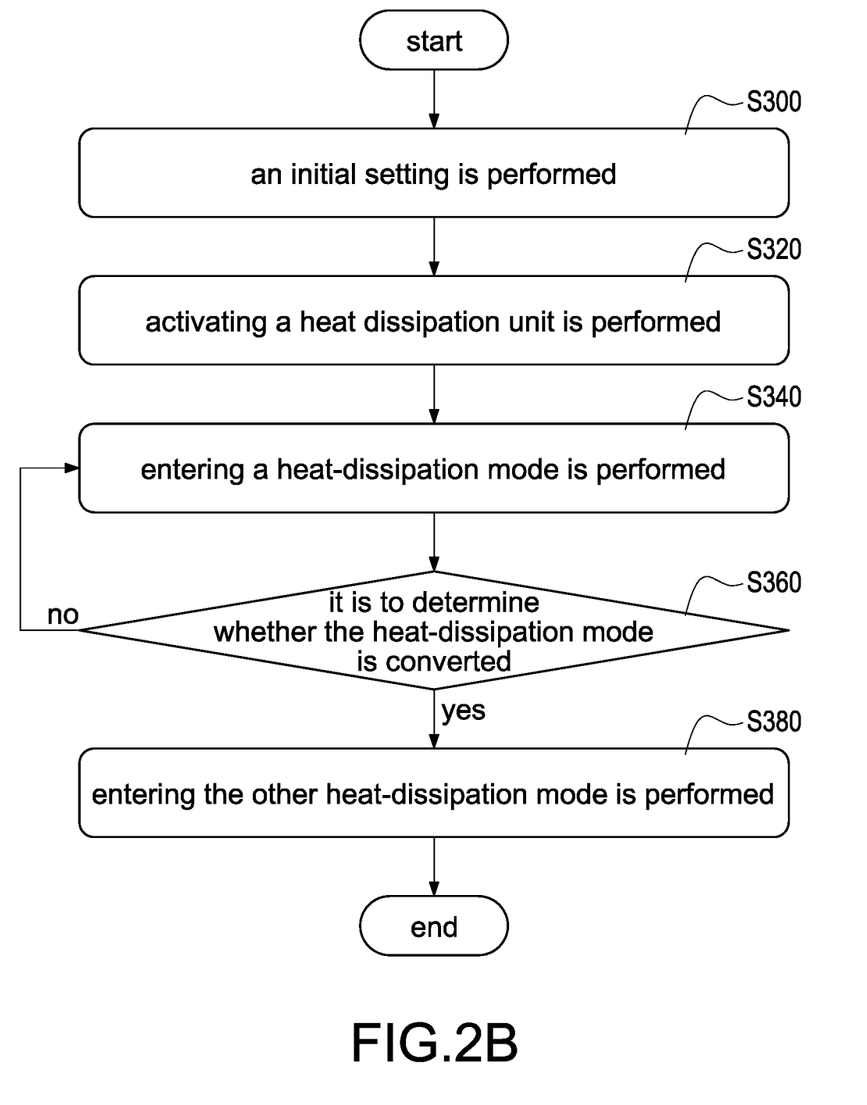
FIG. 2B is a flowchart of controlling a heat dissipation apparatus according to the present disclosure.

Please refer to FIG. 2B, which shows a flowchart of controlling a heat dissipation apparatus according to the present disclosure, and also refer to FIG. 1 to FIG. 2A. An initial setting is performed (S300). When the heat dissipation apparatus 100 activates, the control unit 10 performs the initial setting to determine the heat-dissipation mode, speed, and other parameters at the initial time. Afterward, activating a heat dissipation unit 30 is performed (S320). The control unit 10 performs a procedure of activating the heat dissipation unit 30 so that the heat dissipation unit 30 can normally and stably operate. Afterward, entering a heat-dissipation mode is performed (S340). After the heat dissipation apparatus 100 initially activates, the heat dissipation apparatus 100 can select first to enter the high heat-dissipation mode or the low heat-dissipation mode. In one embodiment, the control unit 10 controls the heat dissipation apparatus 100 to first enter the high heat-dissipation mode so that the heat dissipation apparatus 100 can provide higher heat-dissipating capability when the heat dissipation apparatus 100 just initially activated and a condition of the operation unit 200A is not known. Therefore, it is to avoid that the operation unit 200A happens to be in an excessively high temperature condition at the time of initially activating the heat dissipation apparatus 100. Afterward, it is to determine whether the heat-dissipation mode is converted (S360). After the heat dissipation apparatus 100 is activated, it is to determine whether the heat-dissipation mode is converted from the high heat-dissipation mode to the low heat-dissipation mode according to the first control signal Sc1 provided by the operation unit 200A. If the determination is "No", the process returns to the step (S340). It the determination is "Yes", entering the other heat-dissipation mode is performed (S380) so that the control unit 10 controls the heat dissipation apparatus 100 entering the low heat-dissipation mode. In particular, if the control unit 10 controls the heat dissipation apparatus 100 to first enter the low heat-dissipation mode in the step (S340), and the subsequent steps are oppositely performed to satisfy that the heat dissipation apparatus 100 first enters the low heat-dissipation mode, and the detail description is omitted here for conciseness.

Figure 2C:
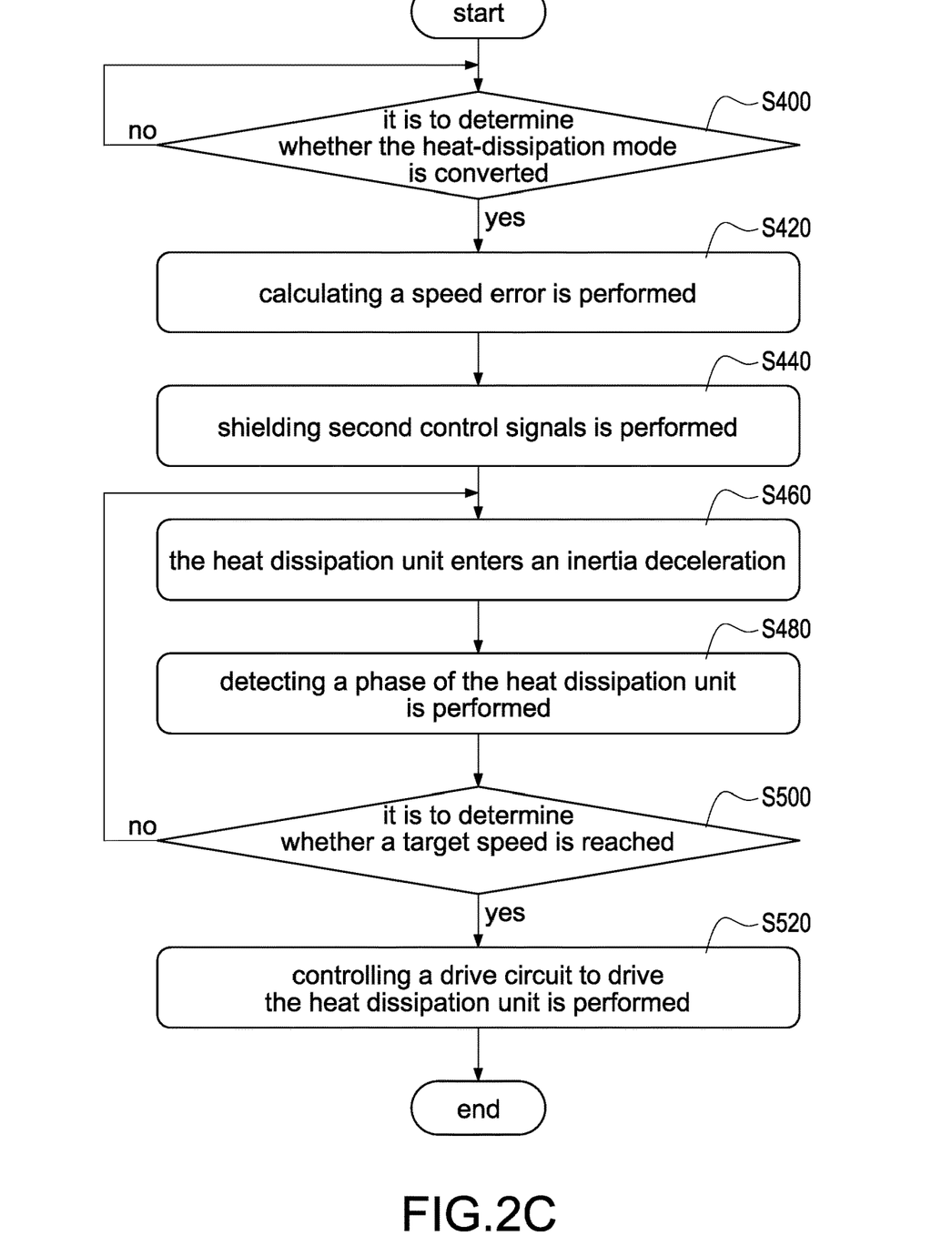
FIG. 2C is a flowchart of entering a low heat-dissipation mode of the heat dissipation apparatus according to the present disclosure.

Please refer to FIG. 2C, which shows a flowchart of entering a low heat-dissipation mode of the heat dissipation apparatus according to the present disclosure, and also refer to FIG. 1 to FIG. 2B. It is to determine whether the heat-dissipation mode is converted (S400). The heat dissipation apparatus 100 determines whether the heat-dissipation mode is converted from the high heat-dissipation mode to the low heat-dissipation mode according to the first control signal Sc1 provided by the operation unit 200A. If the determination is "No", the process returns to the step (S400). If the determination is "Yes", calculating a speed error is performed (S420). A speed difference is calculated between a current speed (for example but not limited to 2000 rpm at the high heat-dissipation mode) and a target speed of the heat dissipation unit 30 and set by the control unit 10 (for example but not limited to 200 rpm at the low heat-dissipation mode). Afterward, shielding second control signals is performed (S440). After calculating the speed difference, the control unit 10 shields the second control signals Sc2 so that the control unit 10 does not provide the second control signals Sc2 to the drive circuit 20. Since the control unit 10 does not provide the second control signals Sc2 to the drive circuit 20, the drive circuit 20 cannot control the heat dissipation unit 30. Therefore, the drive current received by the heat dissipation unit 30 drops to a critical current (for example, a very small current value or zero current value) in an instant interval. In one embodiment, the "shielding operation" means that the control unit 10 does not output the second control signals Sc2, or although the control unit 10 outputs the second control signals Sc2, the second control signals Sc2 cannot be transmitted to the drive circuit 20.

Afterward, the heat dissipation unit 30 enters an inertia deceleration (S460). Since the heat dissipation unit 30 is not controlled by the drive circuit 20, the heat dissipation unit 30 enters the inertia deceleration, that is, the speed of the heat dissipation unit 30 inertially drops from 2000 rpm. Afterward, detecting a phase of the heat dissipation unit 30 is performed (S480). During the time period of entering the inertia deceleration of the heat dissipation unit 30, the control unit 10 continuously detects the phase of the heat dissipation unit 30 so that the control unit 10 can drive the heat dissipation unit 30 at the correct phase of the heat dissipation unit 30 when the speed of the heat dissipation unit 30 inertially drops to the target speed. Afterward, it is to determine whether the target speed is reached (S500). During the time period of entering the inertia deceleration of the heat dissipation unit 30, the control unit 10 continuously detects whether the current speed of the heat dissipation unit 30 reaches to the target speed. If the determination is "No", the process returns to the step (S460). If the determination is "Yes", controlling the drive circuit 20 to drive the heat dissipation unit 30 is performed (S520). When the control unit 10 detects that the current speed of the heat dissipation unit 30 reaches to the target speed (200 rpm), the control unit 10 no longer shields the second control signals Sc2 so that the second control signals Sc2 provided by the control unit 10 can be transmitted to the drive circuit 20. At this condition, the drive circuit 20 starts to operate so that the drive current received by the heat dissipation unit 30 is increased from the critical current to the target current. When the drive current received by the heat dissipation unit 30 reaches to the target current, the heat dissipation unit 30 no longer maintains the inertia deceleration, but starts driving and maintains at the target current (200 rpm).

Figure 3:
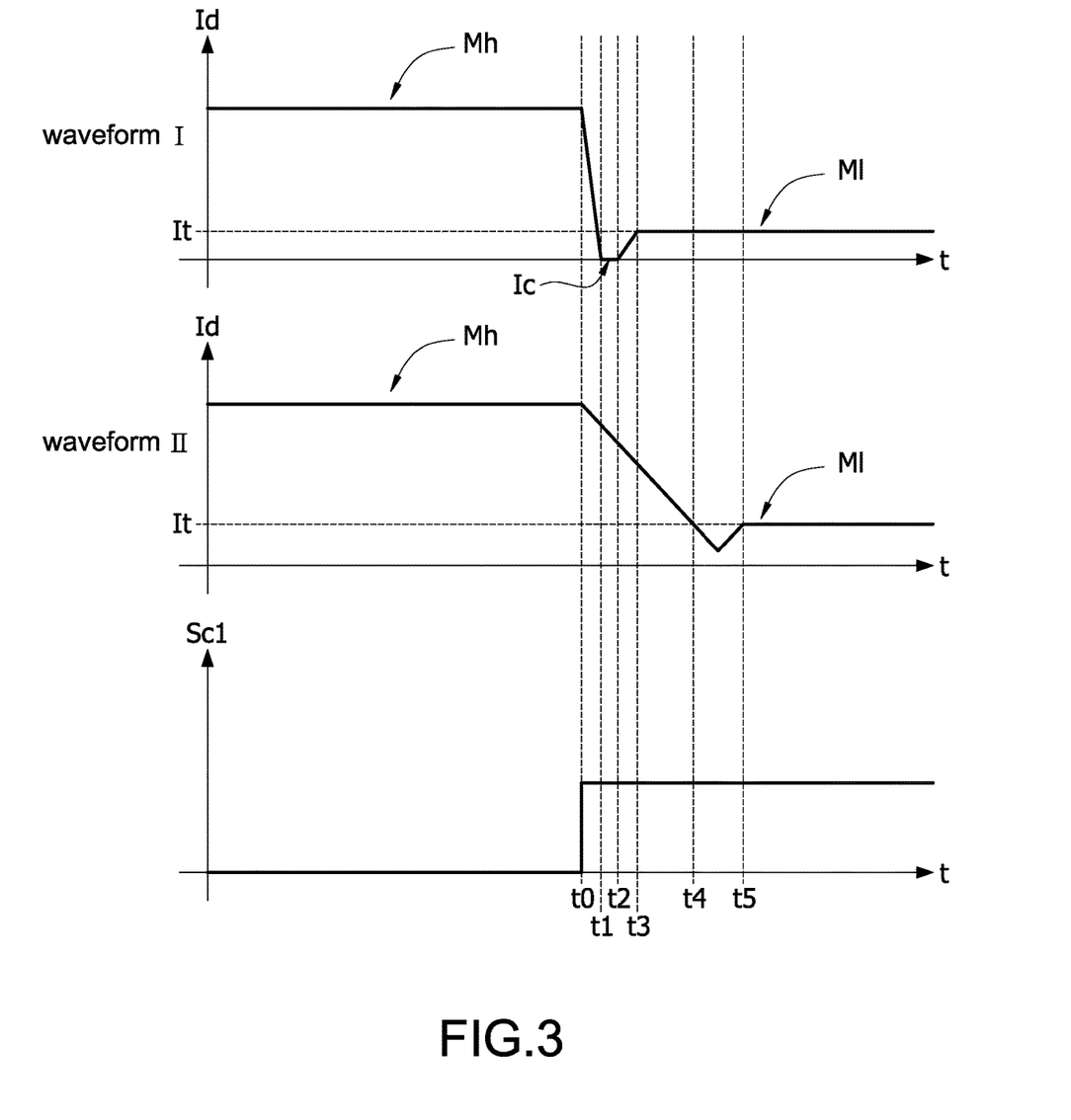
FIG. 3 is a current waveform of entering the low heat-dissipation mode of the heat dissipation apparatus according to the present disclosure.

Please refer to FIG. 3, which shows a current waveform of entering the low heat-dissipation mode of the heat dissipation apparatus according to the present disclosure, and also refer to FIG. 1 to FIG. 2C. The comparison between a waveform I (the present disclosure) and a waveform II (the related art) is shown in FIG. 3. As shown in waveform (the present disclosure), when the control unit 10 determines that the heat dissipation apparatus 100 operates from the high heat-dissipation mode Mh to the low heat-dissipation mode Ml according to the first control signal Sc1, the control unit 10 shields the second control signals Sc2 without driving the drive circuit 20 so that the drive current Id received by the heat dissipation unit 30 drops to the critical current Ic in an instant interval (t0-t1). The time length of the instant interval t0-t1 is about 1-2 milliseconds. On the contrary, as shown in waveform II (the related art), the control unit controls the heat dissipation unit to slow down and the drive current Id is gradually decreased. In waveform I, in a time interval t1-t2, since the speed of the heat dissipation unit 30 has not been decreased to the target speed, the drive current Id is maintained at the critical current Ic. In waveform II, the control unit still controls the heat dissipation unit to slow down and the drive current Id is still decreased. In waveform I, in a time interval t2-t3, since the speed of the heat dissipation unit 30 has decreased to the target speed, the drive current is increased from the critical current Ic to the target current It. In waveform II, the control unit still controls the heat dissipation unit to slow down and the drive current Id is still decreased. In waveform II, in a time interval t4-t5, although the drive current Id is decreased to the target current It, the drive current occurs overshoot (i.e., the drive current is still decreased to less than the target current It) due to non-ideal current condition, and the drive current Id is stabilized to the target current It at the time t5. If this overshoot is particularly serious, the heat dissipation apparatus may be abnormally disabled due to current overshoot. In comparison with the related art, the heat dissipation apparatus 100 of the present disclosure has been stably operating for a period of time (t3-t5) in the low heat-dissipation mode Ml.

Since the control unit 10 shields the second control signals Sc2 in the heat dissipation apparatus 100, the drive current Id is maintained at the critical current Ic in the time interval t0-t2 so that the heat dissipation apparatus 100 consumes almost no power. Moreover, the drive current Id is rapidly decreased and the heat dissipation unit 30 enters the inertia deceleration by shielding the second control signals Sc2 by the control unit 10, and therefore converting the heat-dissipation mode by the heat dissipation unit 30 is quickly than that in the related art. In the time interval t2-t3, the drive current Id is increased from the critical current Ic to the target current that is similar to the soft start. Therefore, when the drive current Id reaches to the target current It, there is no overshoot phenomenon as in the related art, nor does it cause the heat dissipation apparatus 100 to fail abnormally due to the overshoot. On the contrary, since the heat dissipation apparatus continuously controls the drive current Id to be decreased from time t0 to time t5 so that the speed of the heat dissipation unit continuously slows down. At this condition, the heat dissipation apparatus 100 continuously consumes power from time t0 to time t5 in the related art. Accordingly, in comparison with the heat dissipation apparatus in the related art, the heat dissipation apparatus 100 of the present disclosure can achieve rapidly converting the heat-dissipation mode and saving power consumption so as to achieve the purpose of saving energy of the heat dissipation apparatus 100.

As shown in FIG. 3, since the drive current Id controlled by the control unit is gradually decreased of the heat dissipation apparatus in the related art is gradually decreased, the time length of the time interval t0-t5 which the drive current Id drops to the target current It is longer, and it usually takes about 12-15 milliseconds. Therefore, the excessive long time of converting the heat-dissipation mode means that the heat dissipation apparatus in the related art consumes more power. In comparison with the related art, the drive current Id of the heat dissipation apparatus 100 of the present disclosure reduces to the critical current Ic within 1 to 2 milliseconds, and subsequently consumes almost no power during the inertia deceleration of the heat dissipation unit 30. Therefore, in comparison with the heat dissipation apparatus in the related art, the heat dissipation apparatus 100 of the present disclosure can save about 73% in power consumption during the heat dissipation apparatus conversion.

Figure 4A:
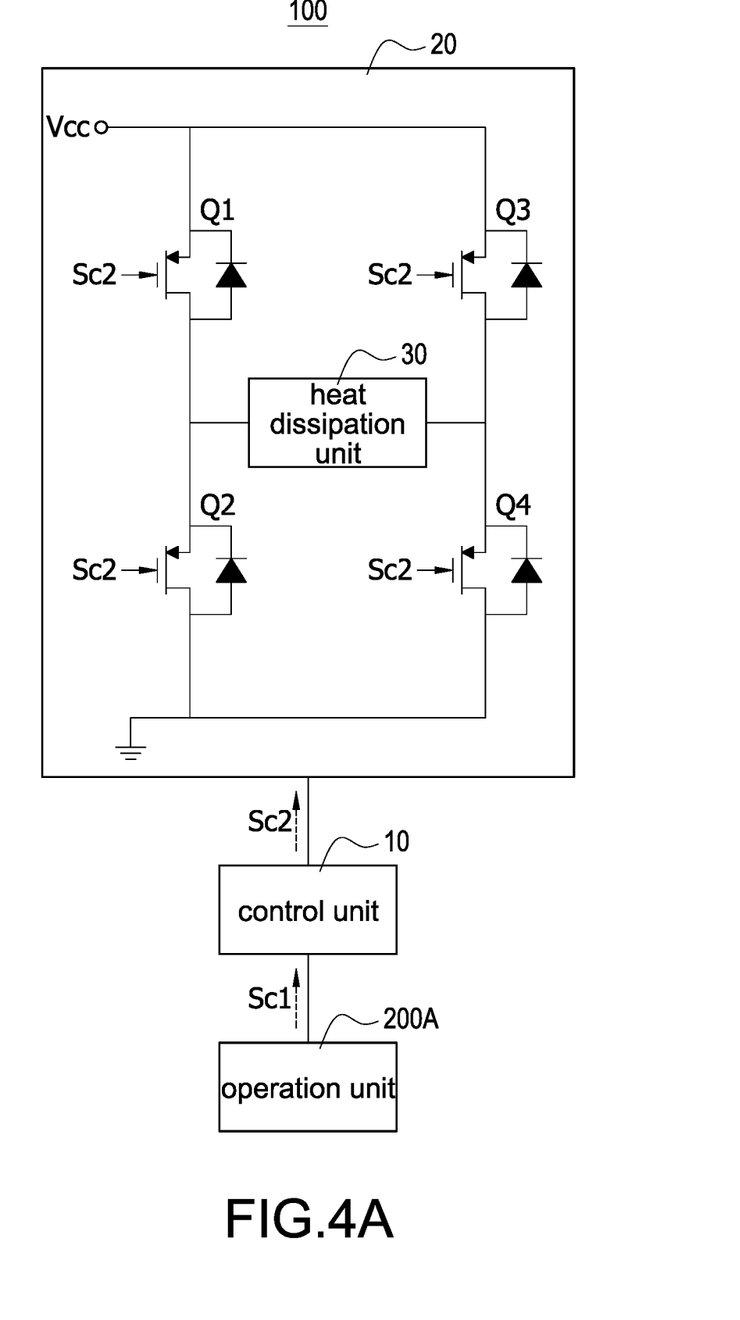
FIG. 4A is a block circuit diagram of the heat dissipation apparatus applied to a single-phase system according to the present disclosure.

Please refer to FIG. 4A, which shows a block circuit diagram of the heat dissipation apparatus applied to a single-phase system according to the present disclosure, and also refer to FIG. 1 to FIG. 3. The drive circuit 20 of the heat dissipation apparatus 100 is a single-phase drive circuit, and the drive circuit 20 has two bridge arms (Q1, Q2 and Q3, Q4) including an upper bridge drive circuit (Q1, Q3) and a lower bridge drive circuit (Q2, Q4). One end of the upper bridge drive circuit (Q1, Q3) is coupled to an input power source Vcc and one end of the lower bridge drive circuit (Q2, Q4) is coupled to a ground point. The other end of the upper bridge drive circuit (Q1, Q3) is coupled to the other end of the lower bridge drive circuit (Q2, Q4) and the heat dissipation unit 30, and a control end of the upper bridge drive circuit (Q1, Q3) and a control end of the lower bridge drive circuit (Q2, Q4) are coupled to the control unit 10. In one embodiment, the heat dissipation unit 30 may be a single-phase fan motor. The number of the second control signals Sc2 provided by the control unit 10 is four, and the second control signals Sc2 are used to respectively control the upper bridge drive circuit (Q1, Q3) and the lower bridge drive circuit (Q2, Q4). When the control unit 10 controls the heat dissipation apparatus 100 entering the low heat-dissipation mode, the control unit 10 shields two second control signals Sc2 of controlling the upper bridge drive circuit (Q1, Q3) and shields two second control signals Sc2 of controlling the lower bridge drive circuit (Q2, Q4), or shields four second control signals Sc2 of controlling the upper bridge drive circuit (Q1, Q3) and the lower bridge drive circuit (Q2, Q4). The above shielding manner can reduce the drive current received by the heat dissipation unit 30 to the critical current. However, shielding the four second control signals Sc2 of controlling the upper bridge drive circuit (Q1, Q3) and the lower bridge drive circuit (Q2, Q4) is better in terms of safety and stability.

Figure 4B:
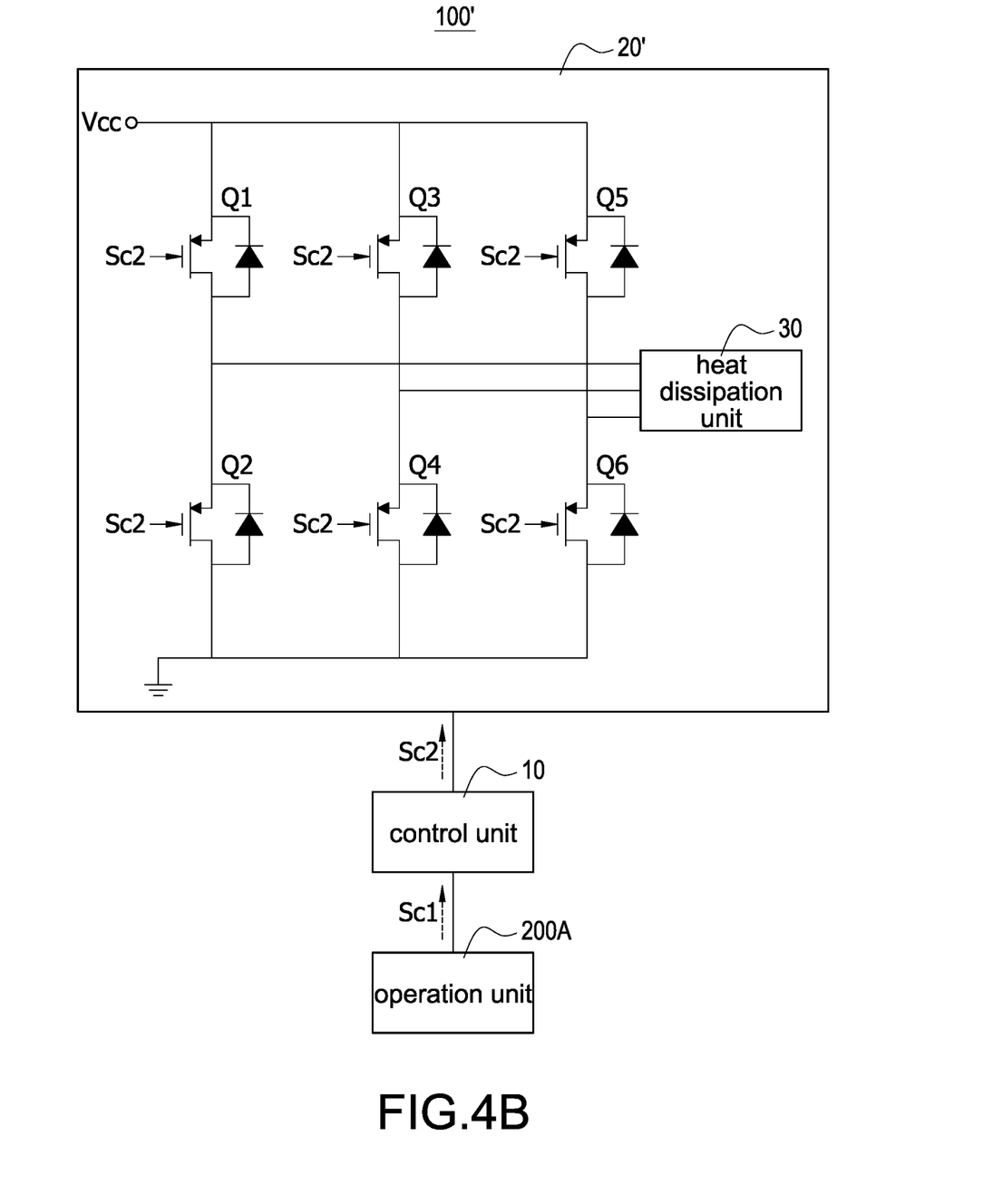
FIG. 4B is a block circuit diagram of the heat dissipation apparatus applied to a three-phase system according to the present disclosure.

Please refer to FIG. 4B, which shows a block circuit diagram of the heat dissipation apparatus applied to a three-phase system according to the present disclosure, and also refer to FIG. 1 to FIG. 3. The major difference between the heat dissipation apparatus 100' shown in FIG. 4B and the heat dissipation apparatus 100 shown in FIG. 4A is that the drive circuit 20' is a three-phase drive circuit including three bridge arms (Q1, Q2, Q3, Q4, and Q5, Q6). The heat dissipation unit 30 may be a three-phase fan motor. The number of the second control signals Sc2 provided by the control unit 10 is six, and the second control signals Sc2 are used to respectively control the upper bridge drive circuit (Q1, Q3, Q5) and the lower bridge drive circuit (Q2, Q4, Q6). In particular, the circuit connection relationship and control manner of the heat dissipation apparatus 100' shown in FIG. 4B are the same as those shown in FIG. 4A, and the detail description is omitted here for conciseness.

Figure 5A:
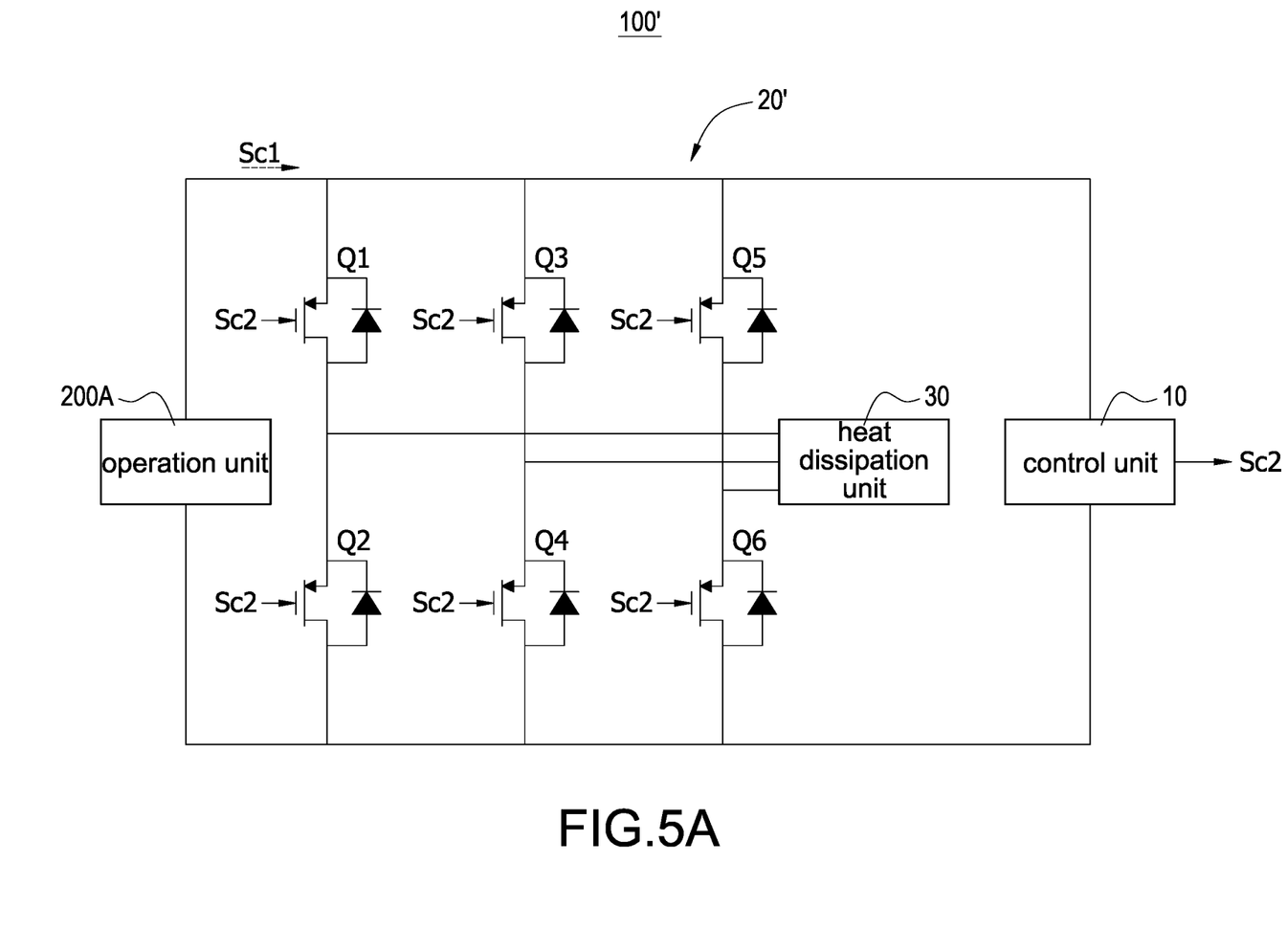
FIG. 5A is a block circuit diagram of a control unit coupled to an operation unit according to a first embodiment of the present disclosure.

Please refer to FIG. 5A, which shows a block circuit diagram of a control unit coupled to an operation unit according to a first embodiment of the present disclosure, also refer to FIG. 1 to FIG. 4B. Take the three-phase system shown in FIG. 4B for example, the control unit 10 is coupled to the operation unit 200A and the drive circuit 20' in parallel, and the first control signal Sc1 is provided to the control unit 10 through the upper bridge drive circuit (Q1, Q3, Q5), that is, the input source of the drive circuit 20' is the first control signal Sc1. In one embodiment, the first control signal Sc1 is a pulse width modulation (PWM) signal. When the operation unit 200A operates from the normal working mode to the energy-saving mode, the first control signal Sc1 may change in frequency, amplitude, or duty cycle. The control unit 10 determines that the heat-dissipation mode has to be converted by detecting the above-described change to respond to the conversion mode of the operation unit 200A.

Figure 5B:
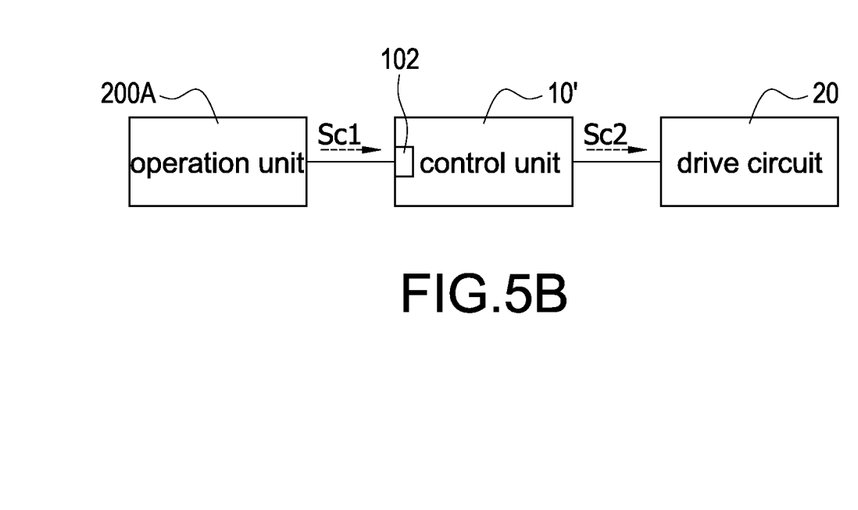
FIG. 5B is a block circuit diagram of the control unit coupled to the operation unit according to a second embodiment of the present disclosure.

Please refer to FIG. 5B, which shows a block circuit diagram of the control unit coupled to the operation unit according to a second embodiment of the present disclosure, also refer to FIG. 1 to FIG. 4B. The major difference between the FIG. 5B and FIG. 5A is that the control unit 10' of the former includes a signal end 102. The control unit 10' is coupled to the operation unit 200A through the signal end 102, and the control unit 10' receives the first control signal Sc1 through the signal end 102. In particular, the first control signal Sc1 can be any type of control signal, such as but not limited to, a PWM signal or a pulse trigger signal, as long as the signal can be determined by the control unit 10'. The signal end 102 of the control unit 10' can be coupled to the operation unit 200A through a wired manner or a wireless manner. When the wireless manner is used (for example but not limited to a network, a short wave, etc.), the control unit 10' can include a signal transceiver unit (not shown). The signal end 102 can be a connector for transmitting or receiving signals, for example but not limited to a RS232, a USB, etc.

In conclusion, the present disclosure has following features and advantages:

1. Since the second control signals are shielded by the control unit in the heat dissipation apparatus of the present disclosure, the heat dissipation apparatus hardly consumes power during the inertia deceleration.

2. Since the present disclosure uses the control unit to shield the second control signals so that the drive current is rapidly decreased and the heat dissipation unit is inertially decelerated, the effect of converting the heat-dissipation mode is more quickly than that in the related art.

3. Since the drive current is increased from the critical current to the target current like the soft start when the speed of the heat dissipation apparatus drops to the target speed, no overshoot phenomenon occurs to cause the heat dissipation apparatus to malfunction due to the overshoot.

4. When the heat dissipation apparatus is initially activated and the condition of the operation unit is not known, the control unit controls the heat dissipation apparatus to first enter the heat-dissipation mode so as to provide a higher heat-dissipating capability, thereby avoiding that the operation unit happens to be in an excessively high temperature condition at the time of initially activating the heat dissipation apparatus.

5. Since the control unit of the present disclosure simultaneously shields and controls the second control signals of the upper bridge drive circuit and the lower bridge drive circuit, the safety and stability of the heat dissipation apparatus can be achieved.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. A heat dissipation apparatus with energy-saving effect coupled to an operation unit, the heat dissipation apparatus comprising:
   a control unit coupled to the operation unit, and
   a drive circuit coupled to the control unit and a heat dissipation unit,
   wherein the control unit is configured to determine whether the operation unit enters an energy-saving mode according to a first signal provided by the operation unit, and the control unit is configured to shield a plurality of second signals provided to the drive circuit according to the energy-saving mode so that the heat dissipation unit enters an inertia deceleration; and
   wherein a drive current received by the heat dissipation unit drops to a critical current in an instant interval through shielding the second signals by the control unit so that the drive circuit is not driven, and a speed of the heat dissipation unit inertially drops from a current speed to a target speed accordingly, and when the speed of the heat dissipation unit inertially drops to the target speed, the control unit provides the second signals to drive the drive circuit so that the drive current is increased from the critical current to a target current.

2. The heat dissipation apparatus in claim 1, wherein the drive circuit comprises:
   an upper bridge drive circuit coupled to control unit and the heat dissipation unit, and
   a lower bridge drive circuit coupled to the control unit, the upper bridge drive circuit, and the heat dissipation unit,
   wherein the plurality of second signals comprises a plurality of upper bridge control signals and a plurality of lower bridge control signals, the control unit is configured to shield the upper bridge control signals and the lower bridge control signals according to the energy-saving mode.

3. The heat dissipation apparatus in claim 1, wherein the first signal is a pulse-width modulation signal.

4. The heat dissipation apparatus in claim 1, wherein the control unit is coupled to the operation unit through a signal end, and the control unit is configured to receive the first signal through the signal end.

5. The heat dissipation apparatus in claim 4, wherein the signal end is coupled to the operation unit by a wired-connected manner or a wireless-connected manner.

6. The heat dissipation apparatus in claim 1, wherein the drive circuit is a single-phase drive circuit and the number of the second signals is four, or the drive circuit is a three-phase drive circuit and the number of the second signals is six.

7. A method of controlling a heat dissipation apparatus with energy-saving effect, the method comprising the steps of:
   receiving a first signal provided by an operation unit;
   determining whether the operation unit enters an energy-saving mode according to the first signal;
   shielding a plurality of second signals provided to a drive circuit according to the energy-saving mode so that the drive circuit is not driven;
   making a speed of a heat dissipation unit coupled to the drive circuit inertially drop from a current speed to a target speed accordingly;
   dropping a drive current received by the heat dissipation unit to a critical current in an instant interval through shielding the second signals; and
   providing the second signals to drive the drive circuit so that the drive current is increased from the critical current to a target current when the speed of the heat dissipation unit inertially drops to the target speed.

8. The method of controlling the heat dissipation apparatus in claim 7, further comprising the step of:
   shielding a plurality of upper bridge control signals or a plurality of lower bridge control signals according to the energy-saving mode, wherein the second signal comprises the upper bridge control signals and the lower bridge control signals.

* * * * *